(12) United States Patent
David et al.

(10) Patent No.: US 8,241,713 B2
(45) Date of Patent: Aug. 14, 2012

(54) MOISTURE BARRIER COATINGS FOR ORGANIC LIGHT EMITTING DIODE DEVICES

(75) Inventors: Moses M. David, Woodbury, MN (US); Fred B. McCormick, Maplewood, MN (US); Mark A. Roehrig, Stillwater, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 967 days.

(21) Appl. No.: 11/677,327

(22) Filed: Feb. 21, 2007

(65) Prior Publication Data

US 2008/0196664 A1 Aug. 21, 2008

(51) Int. Cl.
H05H 1/24 (2006.01)
(52) U.S. Cl. ............ 427/578; 427/249.7; 427/569
(58) Field of Classification Search ........... 427/249.7, 427/569, 578
See application file for complete search history.

(56) References Cited

U.S. PATENT DOCUMENTS

| | | | |
|---|---|---|---|
| 5,298,587 A | 3/1994 | Hu et al. | |
| 5,440,446 A | 8/1995 | Shaw et al. | |
| 5,682,043 A | 10/1997 | Pei et al. | |
| 5,725,909 A | 3/1998 | Shaw et al. | |
| 5,877,895 A | 3/1999 | Shaw et al. | |
| 5,888,594 A | 3/1999 | David et al. | |
| 6,010,751 A | 1/2000 | Shaw et al. | |
| 6,083,313 A | 7/2000 | Venkatraman et al. | |
| 6,203,898 B1 * | 3/2001 | Kohler et al. | 428/339 |
| 6,231,939 B1 | 5/2001 | Shaw et al. | |
| 6,348,237 B2 | 2/2002 | Kohler et al. | |
| 6,413,645 B1 | 7/2002 | Graff et al. | |
| 6,420,003 B2 | 7/2002 | Shaw et al. | |
| 6,492,026 B1 | 12/2002 | Graff et al. | |
| 6,570,325 B2 | 5/2003 | Graff et al. | |
| 6,696,157 B1 * | 2/2004 | David et al. | 428/408 |
| 6,743,524 B2 | 6/2004 | Schaepkens | |
| 7,053,546 B2 | 5/2006 | Hu et al. | |
| 2003/0053784 A1 * | 3/2003 | LaBrake et al. | 385/128 |
| 2004/0144314 A1 | 7/2004 | David et al. | |
| 2005/0178330 A1 * | 8/2005 | Goodwin et al. | 118/723 E |
| 2005/0181198 A1 | 8/2005 | David et al. | |
| 2006/0061272 A1 | 3/2006 | McCormick et al. | |

(Continued)

FOREIGN PATENT DOCUMENTS

EP 0856592 8/1998

(Continued)

OTHER PUBLICATIONS

McCormick, et al., U.S. Appl. No. 11/424,997, filed Jun. 19, 2006 entitled "Moisture Barrier Coatings for Organic Light Emitting Diode Devices".

(Continued)

*Primary Examiner* — Elizabeth Burkhart
(74) *Attorney, Agent, or Firm* — Lisa P. Fulton; James A. Baker

(57) ABSTRACT

A process for fabricating an amorphous diamond-like film layer for protection of a moisture or oxygen sensitive electronic device is described. The process includes forming a plasma from silicone oil, depositing an amorphous diamond-like film layer from the plasma, and combining the amorphous diamond-like film layer with a moisture or oxygen sensitive electronic device to form a protected electronic device. Articles including the amorphous diamond-like film layer on an organic electronic device are also disclosed.

12 Claims, 5 Drawing Sheets

U.S. PATENT DOCUMENTS

2006/0063015 A1 3/2006 McCormick et al.
2007/0020451 A1* 1/2007 Padiyath et al. ............. 428/336

FOREIGN PATENT DOCUMENTS

| JP | 2001-508124 | 6/2001 |
| JP | 2004-323973 | 11/2004 |
| WO | WO 98/20185 | 5/1998 |
| WO | WO 0166820 | 9/2001 |
| WO | WO 2007/015779 | 2/2007 |

OTHER PUBLICATIONS http://www.vitexsys.com/guardian.html, © 2000 Vitex Systems, Inc.

* cited by examiner

MOISTURE BARRIER COATINGS FOR ORGANIC LIGHT EMITTING DIODE DEVICES

FIELD

The present invention relates to barrier coatings for protection of moisture and/or oxygen sensitive electronic devices such as an organic light emitting diode device.

BACKGROUND

Organic light emitting diode (OLED) devices can suffer reduced output or premature failure when exposed to water vapor and/or oxygen. Metals and glasses have been used to encapsulate and prolong the life of OLED devices, but metals typically lack transparency and glass lacks flexibility. Efforts are underway to find alternative encapsulation materials for OLEDs and other electronic devices. Examples of various types of vacuum processes are described in the patent and technical literature for the formation of barrier coatings. These methods span the range of e-beam evaporation, thermal evaporation, electron-cyclotron resonance plasma-enhanced chemical vapor deposition (PECVD), magnetically enhanced PECVD, reactive sputtering, and others.

A need exists for improved encapsulation of organic electronic devices, such as OLEDs, organic photovoltaic devices (OPVs), and organic transistors, and inorganic electronic devices, such as thin film transistors (including those made using zinc oxide (ZnO), amorphous silicon (a-Si), and low temperature polysilicon (LTPSi)).

BRIEF SUMMARY

This disclosure describes an amorphous diamond-like film or coating formed via ion enhanced plasma chemical vapor deposition utilizing silicone oil and an optional silane source to form the plasma. The amorphous diamond-like film forms a moisture or oxygen barrier on a moisture or oxygen sensitive article.

In one embodiment, a process for fabricating an amorphous diamond-like film layer for protection of a moisture or oxygen sensitive electronic device is described. The process includes forming a plasma from silicone oil, depositing an amorphous diamond-like film layer from the plasma, and combining the amorphous diamond-like film layer with a moisture or oxygen sensitive electronic device to form a protected electronic device.

In another embodiment, an article includes an organic electronic device and an amorphous diamond-like film layer adjacent to the organic electronic device. The amorphous diamond-like film layer includes siloxane moiety and has a thickness of greater than 1000 Angstroms.

In a further embodiment, a plasma deposition apparatus includes a vacuum chamber having a powered electrode and a counter electrode, a radio frequency power source in electrical connection with the powered electrode through an impedance matching network, and a silicone oil source in fluid communication with the vacuum chamber.

In another embodiment, a process for fabricating an amorphous diamond-like film layer on a substrate includes forming a radio frequency plasma from silicone oil, and depositing an amorphous diamond-like film layer from the plasma onto a substrate.

BRIEF DESCRIPTION OF THE DRAWINGS

The disclosure may be more completely understood in the following detailed description of various embodiments of the invention in connection with the accompanying drawings, in which.

DETAILED DESCRIPTION

Figure 1:
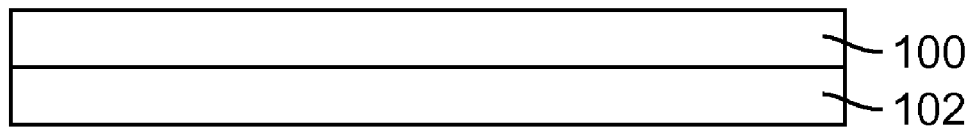
FIG. 1 is a schematic view of a barrier assembly.

An ion enhanced plasma chemical vapor deposition process utilizing a plasma formed from silicone oil and an optional silane source can be used that leads to flexible amorphous diamond-like film layers or coatings having superior moisture vapor barrier performance. Excellent barrier performance can be achieved from these barrier films formed on a substrate in intimate contact with an electrode utilizing radio frequency (RF) plasma conditions. The moisture vapor transmission rates (MVTRs) of these barrier coatings deposited using this process were less than 0.015 g/m$^2$ day measured using ASTM F-1219 at 50 degrees centigrade. Barrier coatings at least 1000 Angstroms (100 nm) thick deposited under high self-bias and low pressures (approximately 5-20 mTorr) result in superior low moisture vapor transmission rates.

The amorphous diamond-like film layers or coatings are deposited on an electrode powered using an RF source operating at least 0.1 W/cm$^2$ of forward power. The vacuum chamber is configured such that these operating conditions result in a very high (>500 V) negative potential on the electrode. As a result of ion bombardment from having high substrate bias (e.g., ion enhanced), the coating formed has very low free volume. The electrode can be water cooled, as desired. In many embodiments, a siloxane source such as vaporized silicone oil is introduced in quantities such that the resulting plasma formed coatings are flexible. These coatings have high optical transmission. Any additional useful process gases, such as oxygen, nitrogen and/or ammonia for example, can be used with the siloxane and optional silane to assist in maintaining the plasma and to modify the properties of the amorphous diamond-like film layers or coatings. Combinations of additional process gases can be employed, as desired.

The amorphous diamond-like film layers or coatings may be used for various types of electronic device (e.g., organic electronic device) applications, for example, organic electroluminescent thin films, photovoltaic devices, thin-film transistors, and other such devices. Electronic device articles having the amorphous diamond-like film layers or coatings may be used in the fabrication of flexible electronic devices such as OLEDs used as a component in displays, solid state lighting or signage; organic transistors; organic (OPVs), silicon and ternary photovoltaics; liquid crystal displays (LCD), and other lighting devices. A partial listing of useful articles of manufacture that can utilize the protected electronic device articles described herein includes cell phones, MP3 players, PDAs, televisions, DVD players, luminares, POP signs, billboards, LCDs, and the like.

These amorphous diamond-like film layers or coatings can be used to encapsulate the electronic devices directly, and the amorphous diamond-like film layers or film can be used as a cover for encapsulating the electronic devices. Due to the superior barrier performance of the amorphous diamond-like film layers or coatings produced using the described ion enhanced plasma chemical vapor deposition conditions, such devices can be produced at a lower cost with better performance.

The term "polymer" refers to homopolymers and copolymers, as well as homopolymers or copolymers that may be formed in a miscible blend, e.g., by coextrusion or by reaction, including, e.g., transesterification. The term "polymer" also includes plasma deposited polymers. The term "copolymer" includes both random and block copolymers. The term "curable polymer" includes both crosslinked and uncrosslinked polymers. The term "crosslinked" polymer refers to a polymer whose polymer chains are joined together by covalent chemical bonds, usually via crosslinking molecules or groups, to form a network polymer. A crosslinked polymer is generally characterized by insolubility, but may be swellable in the presence of an appropriate solvent.

The term a "visible light-transmissive" support, layer, assembly or device means that the support, layer, assembly or device has an average transmission over the visible portion of the spectrum, Tvis, of at least about 20%, measured along the normal axis.

The term "amorphous diamond-like film" refers to substantially (i.e., greater than 95%) or completely amorphous glass including silicone, and optionally including one or more additional components selected from the group including carbon, hydrogen, nitrogen, oxygen, fluorine, sulfur, titanium, and copper. Other elements may be present in certain embodiments. The amorphous diamond-like films may contain clustering of atoms to give it a short-range order but are essentially void of medium and long range ordering that lead to micro or macro crystallinity which can adversely scatter radiation having wavelengths of from 180 nanometers (nm) to 800 nm.

As used herein, "comprising" and "including" are used in an open-ended fashion, and thus should be interpreted to mean "including, but not limited to . . . ".

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Silicone, silicone oil, or siloxanes are used interchangeably and refer to oligomeric and higher molecular weight molecules having a structural unit $R_2SiO$ in which R is independently selected from hydrogen, $(C_1\text{-}C_8)$alkyl, $(C_5\text{-}C_{18})$aryl, $(C_6\text{-}C_{26})$arylalkyl, or $(C_6\text{-}C_{26})$alkylaryl. These can also be referred to as polyorganosiloxanes and include chains of alternating silicon and oxygen atoms (—O—Si—O—Si—O—) with the free valences of the silicon atoms joined usually to R groups, but may also be joined (crosslinked) to oxygen atoms and silicon atoms of a second chain, forming an extended network (high MW).

FIG. 1 is a schematic view of a barrier assembly having an amorphous diamond-like film, layer, or coating 100 to reduce or prevent substantial transfer of moisture and/or oxygen, or other contaminants, to an underlying substrate or electronic device 102. The assembly can represent any type of substrate or electronic device requiring or benefiting from protection from moisture and/or oxygen, such as the moisture and/or oxygen sensitive examples provided above. For certain types of electronic or display devices, for example, oxygen and/or moisture can severely degrade their performance or lifetime, and thus the coating 100 can provide significant advantages in device performance.

In some embodiments, the amorphous diamond-like film, layer, or coating 100 is deposited onto one or both sides of a flexible film 102. The flexible film 102 can be formed of any useful material such as polymeric and/or metallic materials. In some of these embodiments, an electronic device is formed or disposed on or adjacent to either, the amorphous diamond-like film 100, or onto the flexible film 102.

While the electronic device or flexible film 102 is illustrated as a planar element, it is understood that the electronic device or flexible film 102 can have any shape. In many embodiments, the electronic device or flexible film 102 includes a non-planar or structured surface having a surface topography. This disclosure allows a generally uniform layer of barrier coating to be disposed on the structured surface on both horizontal and vertical surfaces that form the surface topography. The amorphous diamond-like film 100 can be any useful thickness. In many embodiments, the an amorphous diamond-like film 100 can have a thickness of greater than 500 Angstroms, or greater than 1,000 Angstroms. In many embodiments, the amorphous diamond-like film 100 can have a thickness in a range from 1,000 to 50,000 Angstroms, or from 1,000 to 25,000 Angstroms, or from 1,000 to 10,000 Angstroms.

In some embodiments, the an amorphous diamond-like film 100 includes one or more amorphous diamond-like film layers or an amorphous diamond-like film layer formed by changing or pulsing the process gases that form the plasma for depositing the amorphous diamond-like film layer 100. For example, a base layer of a first amorphous diamond-like film can be formed an then a second layer of a second amorphous diamond-like film can be formed on the first layer, where the first layer has a different composition than the second layer. In some embodiments, a first amorphous diamond-like film layer is formed from a silicone oil plasma and then a second amorphous diamond-like film layer is formed from a silicone oil and silane plasma. In other embodiments, two or more amorphous diamond-like films layers of alternating composition are formed to create the amorphous diamond-like film 100.

One aspect of this disclosure is that the substrates for deposition of the amorphous diamond-like film from the plasma are subject to intense ion bombardment during the deposition process. As a result of this ion bombardment, the resulting film is densified and its density can be controlled by the degree of ion bombardment. Furthermore, the ion bombardment leads to better coverage of the depositing amorphous diamond-like film over surface features or the topography of the substrate. In many embodiments, it is important to conformally deposit amorphous diamond-like film over the surface topography, particularly over steps and defect sites on the substrate. In the presence of the ion bombardment, the surface mobility of the depositing species is improved, leading to improved step coverage and coverage over any defects which might be present on the surface of the substrate.

Ion bombardment is achieved in this disclosure by means of an asymmetric electrode system with the articles for deposition placed on the powered electrode (as described below). The asymmetric attribute is obtained by making the powered electrode of smaller area when compared to the grounded chamber wall. The negative DC self-bias voltages achieved at the operating pressure of 1-100 mTorr are in the range of 100-1500 volts. The presence of this voltage causes the positive ions in the plasma to be accelerated towards the substrate surface, leading to intense ion bombardment of the substrate surface.

A surprising attribute of this disclosure is that the electronic devices (e.g., organic light emitting devices) are not damaged by the presence of a large negative DC self-bias voltage of several hundred volts which leads to intense ion bombardment. In the case of fabrication of other microelectronic devices, particular care is taken to prevent the devices from getting damaged by the ion bombardment. Not only is it surprising that the organic electronic devices are not damaged by the ion bombardment but this ion-bombardment was found to be provide improved moisture barrier performance of the amorphous diamond-like film.

Figure 2:
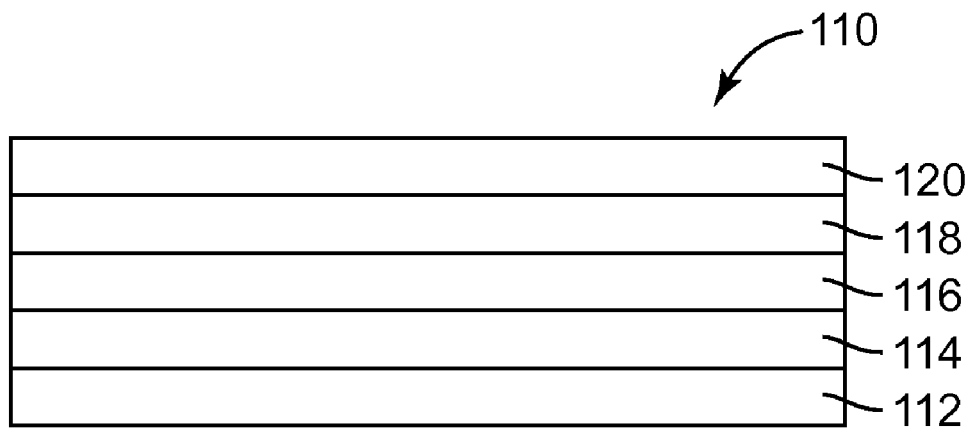
FIG. 2 is a schematic view of a barrier assembly having multiple layers made from alternating amorphous diamond-like layers and polymer layers.
Figure 3:
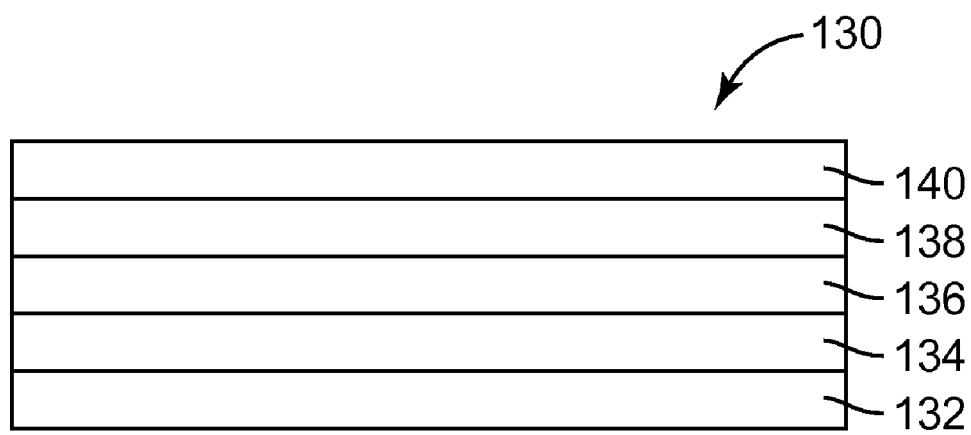
FIG. 3 is a schematic view of a laminated barrier assembly having multiple layers made from polymers.

FIG. 2 is a schematic view of a laminated barrier assembly 110 having multiple layers made from alternating amorphous diamond-like film layers 116, 120 and polymer layers 114, 118 protecting an underlying substrate or electronic device 112. FIG. 3 is a schematic view of a laminated barrier assembly 130 having multiple layers made from alternating different types of polymer layers, for example alternating polymer layers 136, 140 and polymer layers 134, 138 protecting an underlying substrate or electronic device 132. In this example, layers 136 and 140 are composed of a first type of polymer, and layers 134 and 138 are composed of a second type of polymer different from the first type of polymer. Any highly crosslinked polymers may be used for the layers, examples of which are provided below. An amorphous diamond-like film can be disposed on the assembly 130. Each group of different polymers (e.g., 134 and 136), or combinations of polymers including amorphous diamond-like film (e.g., 114 and 116), are referred to as a dyad, and the assembly can include any number of dyads. It can also include various types of optional layers between the dyads, examples of which are provided below.

Assemblies 110 and 130 can include any number of alternating or other layers. Adding more layers may improve the lifetime of the assemblies by increasing their imperviousness to oxygen, moisture, or other contaminants. Use of more or multiple layers may also help cover or encapsulate defects within the layers. The number of layers can be selected, based upon particular implementations or other factors.

Substrates having moisture or oxygen barrier coatings can include any type of substrate material for use in making an electronic device. The substrate can be rigid, for example by using glass or other materials. The substrate can also be curved or flexible, for example by using plastics, metals, or other materials. The substrate can be of any desired shape, and it can be transparent or opaque. In many embodiments, electronic device substrates are flexible plastic materials including thermoplastic films such as polyesters (e.g., PET), polyacrylates (e.g., polymethyl methacrylate), polycarbonates, polypropylenes, high or low density polyethylenes, polyethylene naphthalates, polysulfones, polyether sulfones, polyurethanes, polyamides, polyvinyl butyral, polyvinyl chloride, polyvinylidene difluoride and polyethylene sulfide, and thermoset films such as cellulose derivatives, polyimide, polyimide benzoxazole, and poly benzoxazole.

Other suitable materials for the substrate include chlorotrifluoroethylene-vinylidene fluoride copolymer (CTFE/VDF), ethylene-chlorotrifluoroethylene copolymer (ECTFE), ethylene-tetrafluoroethylene copolymer (ETFE), fluorinated ethylene-propylene copolymer (FEP), polychlorotrifluoroethylene (PCTFE), perfluoroalkyl-tetrafluoroethylene copolymer (PFA), polytetrafluoroethylene (PTFE), polyvinylidene fluoride (PVDF), polyvinyl fluoride (PVF), tetrafluoroethylene-hexafluoropropylene copolymer (TFE/HFP), tetrafluoroethylene-hexafluoropropylene-vinylidene fluoride terpolymer (THV), polychlorotrifluoroethylene (PCTFE), hexafluoropropylene-vinylidene fluoride copolymer (HFP/VDF), tetrafluoroethylene-propylene copolymer (TFE/P), and tetrafluoroethylene-perfluoromethylether copolymer (TFE/PFMe).

Other suitable materials for the substrate include metals and metal alloys. Examples of metals for the substrate include copper, silver, nickel, chromium, tin, gold, indium, iron, zinc, and aluminum. Examples of metal alloys for the substrate include alloys of these listed metals. Another particularly suitable material for the substrate is steel. The metals and metal alloys can be implemented with foils for flexible devices, for example. The metal or metal alloy substrates can include additional materials such as a metal coating on a polymer film.

Alternative substrates include materials having a high glass transition temperature (Tg) barrier, preferably being heat-stabilized, using heat setting, annealing under tension, or other techniques that will discourage shrinkage up to at least the heat stabilization temperature when the support is not constrained. If the support has not been heat stabilized, then it preferably has a Tg greater than that of polymethyl methacrylate (PMMA, Tg=105 degrees centigrade). More preferably the support has a Tg of at least about 110 degrees centigrade, or at least about 120 degrees centigrade, or at least about 128 degrees centigrade. In addition to heat-stabilized polyethylene terephthalate (HSPET), other preferred supports include other heat-stabilized high Tg polyesters, PMMA, styrene/acrylonitrile (SAN, Tg=110 degrees centigrade), styrene/maleic anhydride (SMA, Tg=115 degrees centigrade), polyethylene naphthalate (PEN, Tg=about 120 degrees centigrade), polyoxymethylene (POM, Tg=about 125 degrees centigrade), polyvinylnaphthalene (PVN, Tg=about 135 degrees centigrade), polyetheretherketone (PEEK, Tg=about 145 degrees centigrade), polyaryletherketone (PAEK, Tg=145 degrees centigrade), high Tg fluoropolymers (e.g., DYNEON™ HTE terpolymer of hexafluoropropylene, tetrafluoroethylene, and ethylene, Tg=about 149 degrees centigrade), polycarbonate (PC, Tg=about 150 degrees centigrade), poly alpha-methyl styrene (Tg=about 175 degrees centigrade), polyarylate (PAR, Tg=325 degrees centigrade) fluorene polyester (FPE, Tg=325 degrees centigrade), polynorborene (PCO, Tg=330 degrees centigrade), polysulfone (PSul, Tg=about 195 degrees centigrade), polyphenylene oxide (PPO, Tg=about 200 degrees centigrade), polyetherimide (PEI, Tg=about 218 degrees centigrade), polyarylsulfone (PAS, Tg=220 degrees centigrade), poly ether sulfone (PES, Tg=about 225 degrees centigrade), polyamideimide (PAI, Tg=about 275 degrees centigrade), polyimide (Tg=about 300 degrees centigrade) and polyphthalamide (heat deflection temp of 120 degrees centigrade). For applications where material costs are important, supports made of HSPET and PEN are especially preferred. For applications where barrier performance is paramount, supports made of more expensive materials may be employed. In many embodiments, the electronic device substrate has a thickness of about 0.01 millimeters (mm) to about 1 mm, or about 0.05 mm to about 0.25 mm.

Amorphous diamond-like film is an amorphous carbon system including a substantial quantity of carbon, silicon or silicone and oxygen that exhibits diamond-like properties. In these films, on a hydrogen-free basis, there is at least 5% carbon, a substantial amount of silicon (typically at least 25%) and no more than 50% oxygen. The unique combination of a fairly high amount of silicon with a significant amount of oxygen and a substantial amount of carbon makes these films highly transparent and flexible (unlike glass).

Amorphous diamond-like thin films may have a variety of light transmissive properties. Depending upon the composition, the amorphous diamond-like films may have increased transmissive properties at various frequencies. However, in specific implementations the amorphous diamond-like film (when approximately one micrometer thick) is at least 70% transmissive to radiation at substantially all wavelengths from about 250 nm to about 800 nm and more preferably from about 400 nm to about 800 nm. The extinction coefficient of amorphous diamond-like film is as follows: 70% transmission for a one micrometer thick film corresponds to an extinction coefficient (k) of less than 0.02 in the visible wavelength range between 400 nm and 800 nm.

Diamond-like films, having significantly different properties from the amorphous diamond-like film of the present disclosure due to the arrangement and intermolecular bonds of carbon atoms in the specific material, have previously been described. The type and amount of intermolecular bonds are determined by infrared (IR) and nuclear magnetic resonance (NMR) spectra. Carbon deposits contain substantially two types of carbon-carbon bonds: trigonal graphite bonds (sp2) and tetrahedral diamond bonds (sp3).

Diamond is composed of virtually all tetrahedral bonds, while diamond-like films are composed of approximately 50% to 90% tetrahedral bonds, and graphite is composed of virtually all trigonal bonds.

The crystallinity and the nature of the bonding of the carbon system determine the physical and chemical properties of the deposit. Diamond is crystalline whereas the diamond-like film is a non-crystalline glassy amorphous material, as determined by x-ray diffraction. Diamond is essentially pure carbon, whereas diamond-like film contains a substantial amount of non-carbon components, including silicon.

Diamond has the highest packing density, or gram atom density (GAD) of any material at ambient pressure. Its GAD is 0.28 gram atoms/cc. Amorphous diamond-like films have a GAD ranging from about 0.20 to 0.28 gram atoms/cc. In contrast, graphite has a GAD of 0.18 gram atoms/cc. The high packing density of diamond-like film affords excellent resistance to diffusion of liquid or gaseous materials. Gram atom density is calculated from measurements of the weight and thickness of a material. The term "gram atom" refers to the atomic weight of a material expressed in grams.

Amorphous diamond-like film is diamond-like because, in addition to the foregoing physical properties that are similar to diamond, it has many of the desirable performance properties of diamond such as extreme hardness (typically 1000 to 2000 kg/mm$^2$), high electrical resistivity (often 109 to 1013 ohm-cm), a low coefficient of friction (for example, 0.1), and optical transparency over a wide range of wavelengths (a typical extinction coefficient of about between 0.01 and 0.02 in the 400 nm to 800 nm range).

Diamond films also have some properties which, in many applications, make them less beneficial than amorphous diamond-like films. Diamond films usually have grain structures, as determined by electron microscopy. The grain boundaries are a path for chemical attack and degradation of the substrates, and also cause scattering of actinic radiation. Amorphous diamond-like film does not have a grain structure, as determined by electron microscopy, and is thus well suited to applications wherein actinic radiation will pass through the film. The polycrystalline structure of diamond films causes light scattering from the grain boundaries.

In creating an amorphous diamond-like film, various additional components can be incorporated into the basic SiOCH composition. These additional components can be used to alter and enhance the properties that the amorphous diamond-like film imparts to the electronic device substrate. For example, it may be desirable to further enhance the barrier and surface properties.

The additional components may include one or more of hydrogen (if not already incorporated), nitrogen, fluorine, sulfur, titanium, or copper. Other additional components may also be of benefit. The addition of hydrogen promotes the formation of tetrahedral bonds. The addition of fluorine is particularly useful in enhancing barrier and surface properties of the amorphous diamond-like film, including the ability to be dispersed in an incompatible matrix. The addition of nitrogen may be used to enhance resistance to oxidation and to increase electrical conductivity. The addition of sulfur can enhance adhesion. The addition of titanium tends to enhance adhesion as well as diffusion and barrier properties.

These amorphous diamond-like materials may be considered as a form of plasma polymers, which can be deposited on the assembly using, for example, a vapor source. The term "plasma polymer" is applied to a class of materials synthesized from a plasma by using precursor monomers and/or oligomers in the gas phase at low temperatures. Precursor molecules are broken down by energetic electrons present in the plasma to form free radical species. These free radical species react at the substrate surface and lead to polymeric thin film growth. Due to the non-specificity of the reaction processes in both the gas phase and the substrate, the resulting polymer films are highly cross-linked and amorphous in nature.

Typically, these plasma polymers have an organic nature to them due to the presence of hydrocarbon and carbonaceous functional groups such as $CH_3$, $CH_2$, CH, Si—C, Si—$CH_3$, Al—C, Si—O—$CH_3$, Si—O—Si, etc. The presence of these functional groups may be ascertained by analytical techniques such as IR, nuclear magnetic resonance (NMR) and secondary ion mass (SIMS) spectroscopies. The carbon content in the film may be quantified by electron spectroscopy for chemical analysis (ESCA).

Not all plasma deposition processes lead to plasma polymers. Inorganic thin films are frequently deposited by plasma enhanced chemical vapor deposition at elevated substrate temperatures to produce thin inorganic films such as amorphous silicon, silicon oxide, silicon nitride, aluminum nitride, etc. Lower temperature processes may be used with inorganic precursors such as silane ($SiH_4$) and ammonia ($NH_3$). In some cases, the organic component present in the precursors is removed in the plasma by feeding the precursor mixture with an excess flow of oxygen. Silicon rich films are produced from tetramethyldisiloxane (TMDSO)-oxygen mixtures where the oxygen flow rate is ten times that of the TMDSO flow. Films produced in these cases have an oxygen to silicon ratio of about 2, which is near that of silicon dioxide.

The amorphous diamond-like film layer of this disclosure is differentiated from other inorganic plasma deposited thin films by the oxygen to silicon ratio in the films and by the amount of carbon and siloxane character present in the films. When a surface analytic technique such as ESCA is used for the analysis, the elemental atomic composition of the film may be obtained on a hydrogen-free basis. Amorphous diamond-like film films of the present disclosure are substantially sub-stoichiometric in their inorganic component and substantially carbon-rich, depicting their organic nature. In films containing silicon for example, the oxygen to silicon ratio is preferably below 1.8 (silicon dioxide has a ratio of 2.0), or below 1.5 as in the case of amorphous diamond-like film, and the carbon content is in a range from about 5 to 50%. Furthermore, the organic siloxane structure (i.e., siloxane moiety) of the films may be detected by IR spectra of the film with the presence of Si—O—Si groups by secondary ion mass spectroscopy (SIMS).

One advantage of amorphous diamond-like film coatings or films that include siloxane is their resistance to cracking in comparison to other films. Amorphous diamond-like film coatings are inherently resistant to cracking either under applied stress or inherent stresses arising from manufacture of the film. In addition amorphous diamond-like film can be formed at greater thicknesses than other plasma barrier films, such as, for example, from 1000 to 25000 Angstroms.

The polymer layers used in the multilayer stack of the barrier assemblies are preferably crosslinkable. The crosslinked polymeric layer lies atop the substrate or other layers, and it can be formed from a variety of materials. Preferably the polymeric layer is crosslinked in-situ atop the underlying layer. If desired, the polymeric layer can be applied using conventional coating methods such as roll coating (e.g., gravure roll coating) or spray coating (e.g., electrostatic spray coating), then crosslinked using, for example, ultraviolet (UV) radiation. Most preferably the polymeric layer is formed by flash evaporation, vapor deposition and crosslinking of a monomer as described in the present specification. Volatilizable (meth)acrylate monomers are preferred for use in such a process, with volatilizable acrylate monomers being especially preferred. Preferred (meth)acrylates have a molecular weight in the range of about 150 to about 600, or about 200 to about 400. Other preferred (meth)acrylates have a value of the ratio of the molecular weight to the number of acrylate functional groups per molecule in the range of about 150 to about 600 g/mole/(meth)acrylate group, or about 200 to about 400 g/mole/(meth)acrylate group. Fluorinated (meth)acrylates can be used at higher molecular weight ranges or ratios, e.g., about 400 to about 3000 molecular weight or about 400 to about 3000 g/mole/(meth)acrylate group. Coating efficiency can be improved by cooling the support. Particularly preferred monomers include multifunctional (meth)acrylates, used alone or in combination with other multifunctional or monofunctional (meth)acrylates, such as hexanediol diacrylate, ethoxyethyl acrylate, phenoxyethyl acrylate, cyanoethyl (mono)acrylate, isobornyl acrylate, isobornyl methacrylate, octadecyl acrylate, isodecyl acrylate, lauryl acrylate, beta-carboxyethyl acrylate, tetrahydrofurfuryl acrylate, dinitrile acrylate, pentafluorophenyl acrylate, nitrophenyl acrylate, 2-phenoxyethyl acrylate, 2-phenoxyethyl methacrylate, 2,2,2-trifluoromethyl (meth) acrylate, diethylene glycol diacrylate, triethylene glycol diacrylate, triethylene glycol dimethacrylate, tripropylene glycol diacrylate, tetraethylene glycol diacrylate, neopentyl glycol diacrylate, propoxylated neopentyl glycol diacrylate, polyethylene glycol diacrylate, tetraethylene glycol diacrylate, bisphenol A epoxy diacrylate, 1,6-hexanediol dimethacrylate, trimethylol propane triacrylate, ethoxylated trimethylol propane triacrylate, propylated trimethylol propane triacrylate, tris(2-hydroxyethyl)isocyanurate triacrylate, pentaerythritol triacrylate, phenylthioethyl acrylate, naphthloxyethyl acrylate, IRR-214 cyclic diacrylate from CYTEC INDUSTRIES, INC., epoxy acrylate RDX80095 from Rad-Cure Corporation, and mixtures thereof. A variety of other curable materials can be included in the crosslinked polymeric layer, e.g., vinyl ethers, vinyl naphthylene, acrylonitrile, and mixtures thereof.

Alternative materials for the polymer layers include materials having a Tg greater than or equal to that of HSPET. A variety of alternative polymer materials can be employed. Volatilizable monomers that form suitably high Tg polymers are especially preferred. Preferably the alternative polymer layer has a Tg greater than that of PMMA, more preferably a Tg of at least about 110 degrees centigrade, yet more preferably at least about 150 degrees centigrade, and most preferably at least about 200 degrees centigrade. Especially preferred monomers that can be used to form this layer include urethane acrylates (e.g., CN-968, Tg=about 84 degrees centigrade and CN-983, Tg=about 90 degrees centigrade, both commercially available from Sartomer Co.), isobornyl acrylate (e.g., SR-506, commercially available from Sartomer Co., Tg=about 88 degrees centigrade), dipentaerythritol pentaacrylates (e.g., SR-399, commercially available from Sartomer Co., Tg=about 90 degrees centigrade), epoxy acrylates blended with styrene (e.g., CN-120S80, commercially available from Sartomer Co., Tg=about 95 degrees centigrade), di-trimethylolpropane tetraacrylates (e.g., SR-355, commercially available from Sartomer Co., Tg=about 98 degrees centigrade), diethylene glycol diacrylates (e.g., SR-230, commercially available from Sartomer Co., Tg=about 100 degrees centigrade), 1,3-butylene glycol diacrylate (e.g., SR-212, commercially available from Sartomer Co., Tg=about 101 degrees centigrade), pentaacrylate esters (e.g., SR-9041, commercially available from Sartomer Co., Tg=about 102 degrees centigrade), pentaerythritol tetraacrylates (e.g., SR-295, commercially available from Sartomer Co., Tg=about 103 degrees centigrade), pentaerythritol triacrylates (e.g., SR-444, commercially available from Sartomer Co., Tg=about 103 degrees centigrade), ethoxylated (3) trimethylolpropane triacrylates (e.g., SR-454, commercially available from Sartomer Co., Tg=about 103 degrees centigrade), ethoxylated (3) trimethylolpropane triacrylates (e.g., SR-454HP, commercially available from Sartomer Co., Tg=about 103 degrees centigrade), alkoxylated trifunctional acrylate esters (e.g., SR-9008, commercially available from Sartomer Co., Tg=about 103 degrees centigrade), dipropylene glycol diacrylates (e.g., SR-508, commercially available from Sartomer Co., Tg=about 104 degrees centigrade), neopentyl glycol diacrylates (e.g., SR-247, commercially available from Sartomer Co., Tg=about 107 degrees centigrade), ethoxylated (4) bisphenol a dimethacrylates (e.g., CD-450, commercially available from Sartomer Co., Tg=about 108 degrees centigrade), cyclohexane dimethanol diacrylate esters (e.g., CD-406, commercially available from Sartomer Co., Tg=about 110 degrees centigrade), isobornyl methacrylate (e.g., SR-423, commercially available from Sartomer Co., Tg=about 110 degrees centigrade), cyclic diacrylates (e.g., IRR-214, commercially available from Cytec Industries, Inc., Tg=about 208 degrees centigrade) and tris (2-hydroxy ethyl) isocyanurate triacrylate (e.g., SR-368, commercially available from Sartomer Co., Tg=about 272 degrees centigrade), acrylates of the foregoing methacrylates and methacrylates of the foregoing acrylates.

Optional layers can include "getter" or "desiccant" layers functionally incorporated within or adjacent to the barrier coating; examples of such layers are described in U.S. Patent Publication Nos. 2006-0063015 and 2006-0061272, which are incorporated herein by reference as if fully set forth. Getter layers include layers with materials that absorb or deactivate oxygen, and desiccant layers include layers with materials that absorb or deactivate water.

Optional layers can include encapsulating films, for example barrier layers, optical films, or structured films. The optical film can include, for example, a light extracting film, a diffuser, or a polarizer. The structured film can include films having microstructured (micron-scaled) features such as prisms, grooves, or lenslets.

In some embodiments, the barrier layers include one or more inorganic barrier layers. The inorganic barrier layers, when multiple such layers are used, do not have to be the same. A variety of inorganic barrier materials can be employed. Preferred inorganic barrier materials include metal oxides, metal nitrides, metal carbides, metal oxynitrides, metal oxyborides, and combinations thereof, e.g., silicon oxides such as silica, aluminum oxides such as alumina, titanium oxides such as titania, indium oxides, tin oxides, indium tin oxide ("ITO"), tantalum oxide, zirconium oxide, niobium oxide, boron carbide, tungsten carbide, silicon carbide, aluminum nitride, silicon nitride, boron nitride, aluminum oxynitride, silicon oxynitride, boron oxynitride, zirconium oxyboride, titanium oxyboride, and combinations thereof. Indium tin oxide, silicon oxide, aluminum oxide and combinations thereof are especially preferred inorganic barrier materials. ITO is an example of a special class of ceramic materials that can become electrically conducting with the proper selection of the relative proportions of each elemental constituent.

The inorganic barrier layers, when incorporated into the assembly, preferably are formed using techniques employed in the film metallizing art such as sputtering (e.g., cathode or planar magnetron sputtering), evaporation (e.g., resistive or electron beam evaporation), chemical vapor deposition, plating and the like. Most preferably the inorganic barrier layers are formed using sputtering, e.g., reactive sputtering. Alternatively, they can be formed atomic layer deposition, which can help to seal pin holes in the barrier coatings.

Enhanced barrier properties have been observed when the inorganic layer is formed by a high energy deposition technique such as sputtering compared to lower energy techniques such as conventional chemical vapor deposition processes. Without being bound by theory, it is believed that the enhanced properties are due to the condensing species arriving at the substrate with greater kinetic energy, leading to a lower void fraction as a result of compaction. The smoothness and continuity of each inorganic barrier layer and its adhesion to the underlying layer can be enhanced by pretreatments (e.g., plasma pretreatment) such as those described above.

The barrier assemblies can also have a protective polymer topcoat layer. If desired, the topcoat polymer layer can be applied using conventional coating methods such as roll coating (e.g., gravure roll coating), spray coating (e.g., electrostatic spray coating), or plasma deposition. A pretreatment (e.g., plasma pretreatment) may be used prior to formation of the topcoat polymer layer. The desired chemical composition and thickness of the topcoat polymer layer will depend in part on the nature and surface topography of the underlying layer(s), the hazards to which the barrier assembly might be exposed, and applicable device requirements. The topcoat polymer layer thickness preferably is sufficient to provide a smooth, defect-free surface that will protect the underlying layers from ordinary hazards.

The polymer layers can be formed by applying a layer of a monomer or oligomer to the substrate and crosslinking the layer to form the polymer in situ, e.g., by flash evaporation and vapor deposition of a radiation-crosslinkable monomer, followed by crosslinking using, for example, an electron beam apparatus, UV light source, electrical discharge apparatus or other suitable device. Coating efficiency can be improved by cooling the support. The monomer or oligomer can also be applied to the substrate using conventional coating methods such as roll coating (e.g., gravure roll coating), spray coating (e.g., electrostatic spray coating), or plasma deposition, then crosslinked as set out above. The polymer layers can also be formed by applying a layer containing an oligomer or polymer in solvent and drying the thus-applied layer to remove the solvent. More preferably, the polymer layers are formed by flash evaporation and vapor deposition followed by crosslinking in-situ.

A roll-to-roll manufacture (web process) to make barrier assemblies is described in U.S. Pat. No. 5,888,594, incorporated herein by reference. In addition to a web process, barrier assemblies can be made in a batch process such as those described below in the Examples.

Organic electronic devices such as OLED devices, OPVs, and organic transistors are often sensitive to oxygen and moisture present in the ambient atmosphere. Embodiments of the present disclosure include the use of an ion enhanced plasma chemical vapor deposition process that leads to amorphous diamond-like coatings having superior moisture vapor barrier performance. In one particular embodiment, amorphous diamond-like barrier coatings are deposited directly onto a bare OLED device with at least no substantial degradation of device performance induced by the deposition process. In a second embodiment, barrier coatings are deposited directly onto an OLED device previously encapsulated with a protective film (e.g., polymer film) that is in intimate contact with the OLED structure with at least no substantial degradation of device performance induced by the deposition process. In a third embodiment, barrier coatings are deposited directly onto an OLED device previously encapsulated with a protective film (e.g., polymer film) that is not in intimate contact with the OLED structure with at least no substantial degradation of device performance induced by the deposition process. In further embodiments, the barrier coatings can also be applied to the surface of the device substrate opposite that which carries the device. In other embodiments, amorphous diamond-like coatings are deposited on a substrate and an organic electronic device is formed or deposited on either side of the amorphous diamond-like coated substrate and then a barrier film is formed or laminated onto the organic electronic device, where the barrier film is an amorphous diamond-like coatings, a polymer barrier layer, or a combination of one or more amorphous diamond-like layers and polymer layers. Any combination of these embodiments is also contemplated.

An OLED is typically a thin film structure formed on a substrate such as glass or transparent plastic. A light-emitting layer of an organic electroluminescent (EL) material and optional adjacent semiconductor layers are located between a cathode and an anode. The EL material can be sandwiched or interdigitated, for example, between the cathode and anode. As an alternative to a conventional OLED device, a light-emitting electrochemical cell may be used, an example of which is described in U.S. Pat. No. 5,682,043, which is incorporated herein by reference. The semiconductor layers may be either hole injection (positive charge) or electron injection (negative charge) layers and also comprise organic materials. The material for the light-emitting layer may be selected from many organic EL materials. The light emitting organic layer may itself include multiple sublayers, each including a different organic EL material. Examples of the organic EL materials include the following: vapor deposited small molecule materials; and solution coated light emitting polymers and small molecules applied by spin coating, inkjet printing, or screen printing. The organic EL material can be transferred to a receptor by laser induced thermal imaging (LITI) to make a LITI patterned device. The OLED devices can include passive matrix OLEDs or active matrix OLEDs. The devices can also include other components for use in driving them such as conductive leads and antennas.

Figure 4A:
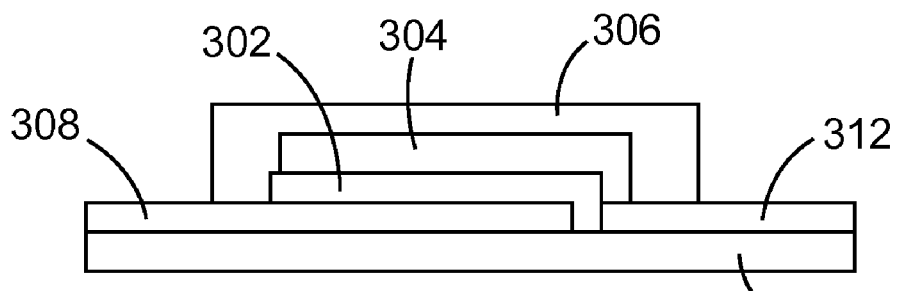
FIGS. 4A-4C are diagrams of first embodiments of OLED devices encapsulated with amorphous diamond-like coatings.
Figure 4B:
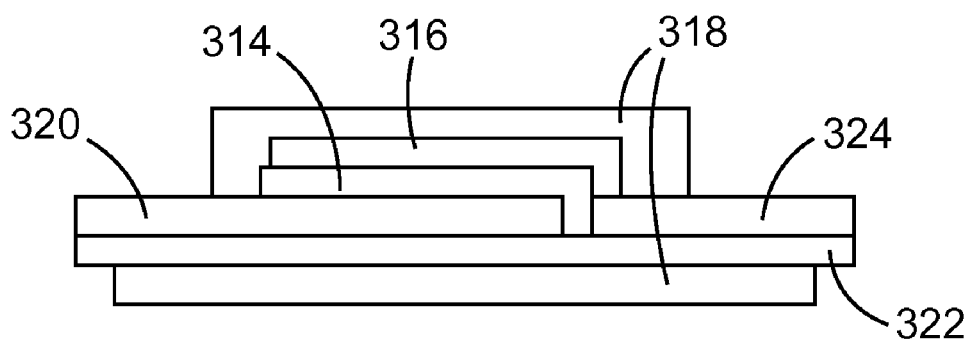
Figure 4C:
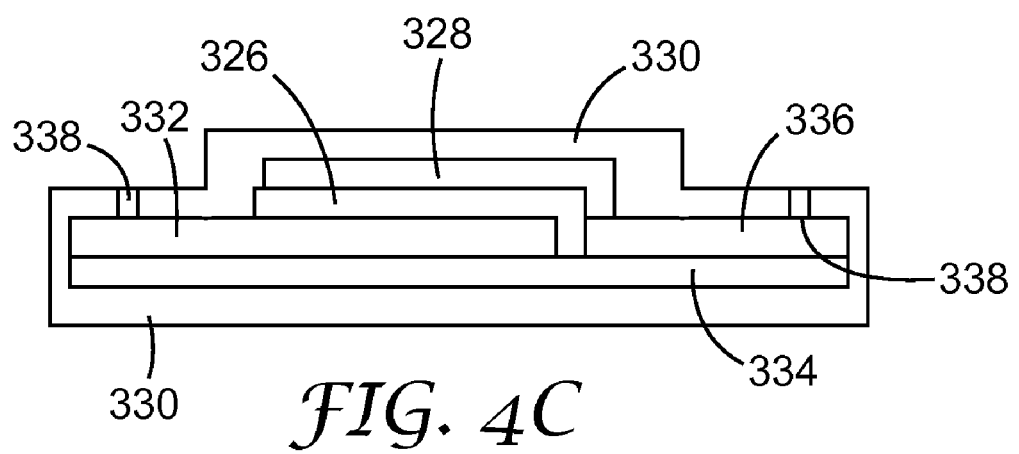

FIGS. 4A-4C, 5A-5C, and 6A-6C show diagrams of various exemplary embodiments of barrier assemblies. FIG. 4A illustrates a device having, with the construction shown, organics 302, a cathode 304, amorphous diamond-like film 306, an anode and lead 308, a substrate 310, and a cathode lead 312. FIG. 4B illustrates a device having, with the construction shown, organics 314, a cathode 316, amorphous diamond-like film 318, an anode and lead 320, a substrate 322, and a cathode lead 324. FIG. 4C illustrates a device having, with the construction shown, organics 326, a cathode 328, amorphous diamond-like film 330, an anode and lead 332, a substrate 334, a cathode lead 336, and contact vias 338. The vias can provide for electrical connection to the cathode and anode leads or other electrodes using, for example, vias conductive adhesives, silver ink, or soldering.

Figure 5A:
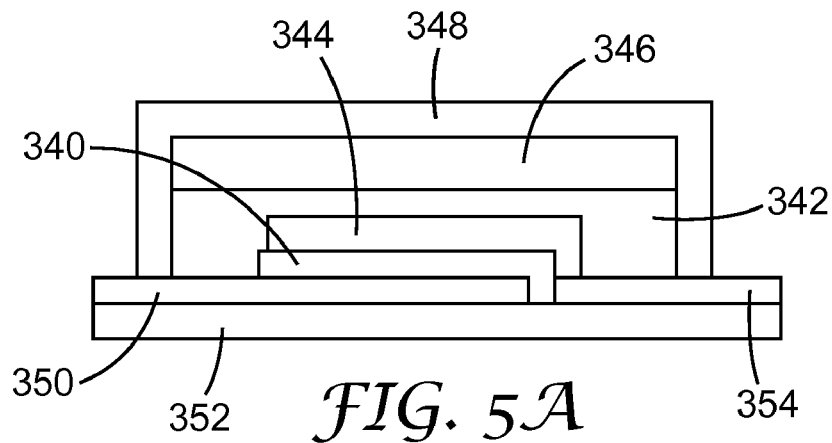
FIGS. 5A-5C are diagrams of second embodiments of OLED devices encapsulated with amorphous diamond-like coatings.
Figure 5B:
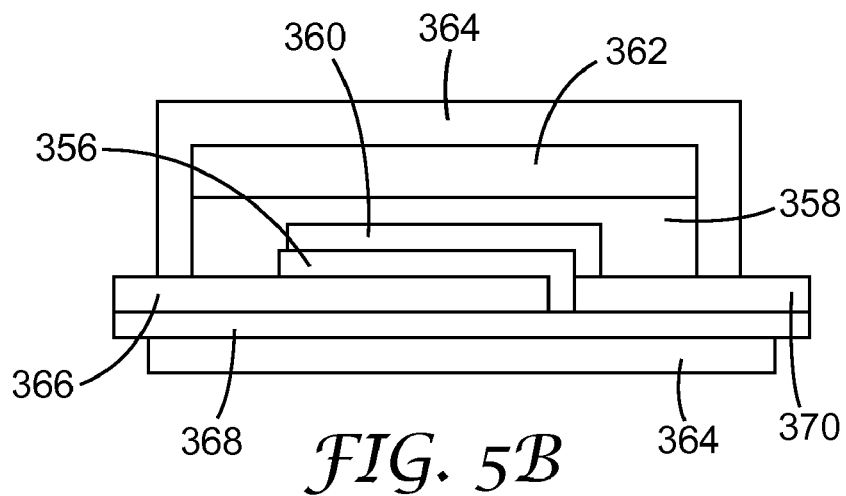
Figure 5C:
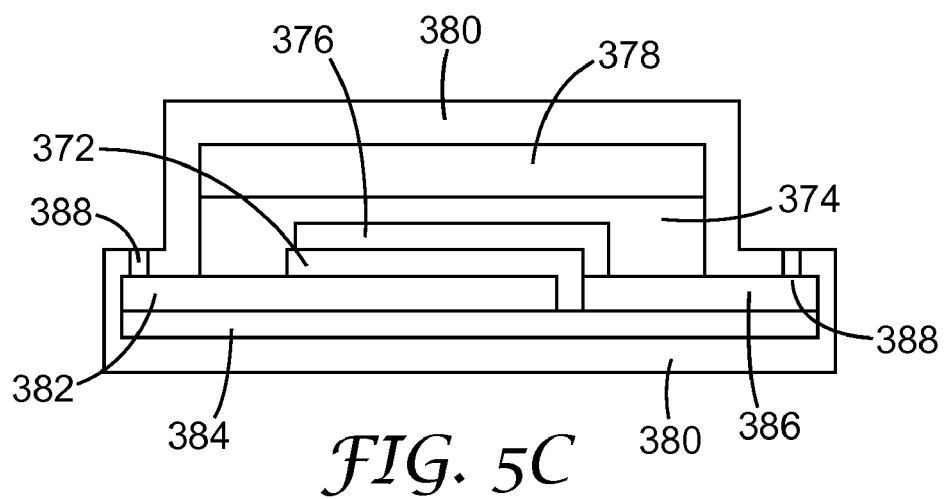

FIG. 5A illustrates a device having, with the construction shown, organics 340, an adhesive 342, a cathode 344, a cover film 346, amorphous diamond-like film 348, an anode and lead 350, a substrate 352, and a cathode lead 354. FIG. 5B illustrates a device having, with the construction shown, organics 356, an adhesive 358, a cathode 360, a cover film 362, amorphous diamond-like film 364, an anode and lead 366, a substrate 368, and a cathode lead 370. FIG. 5C illustrates a device having, with the construction shown, organics 372, an adhesive 374, a cathode 376, a cover film 378, amorphous diamond-like film 380, an anode and lead 382, a substrate 384, a cathode lead 386, and contact vias 388.

Figure 6A:
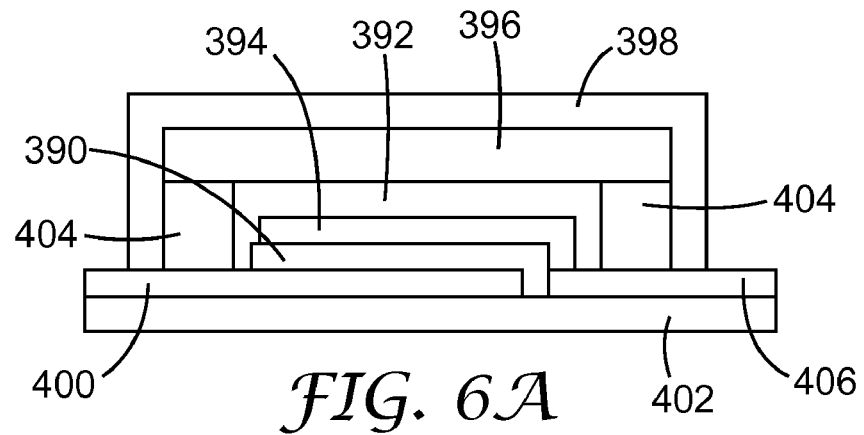
FIGS. 6A-6C are diagrams of third embodiments of OLED devices encapsulated with amorphous diamond-like coatings.
Figure 6B:
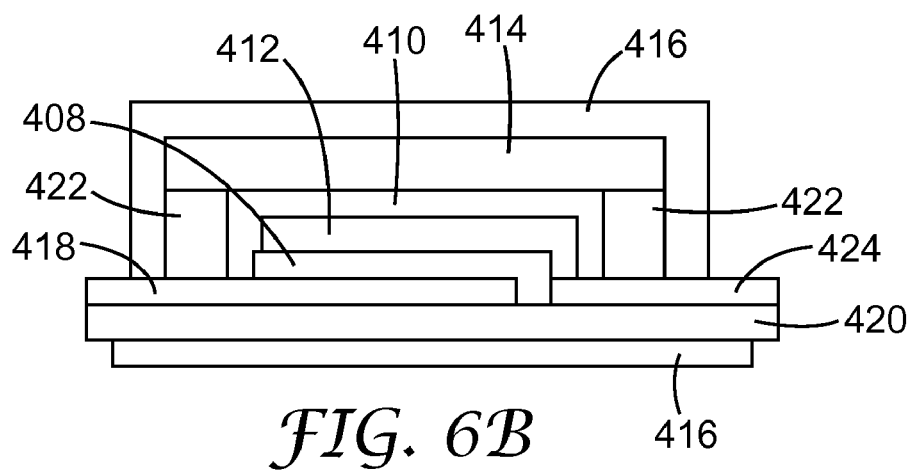
Figure 6C:
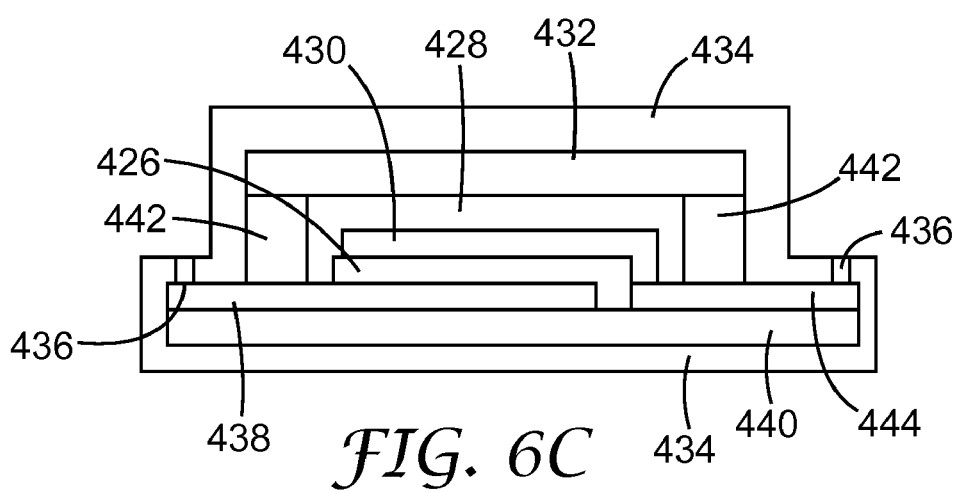

FIG. 6A illustrates a device having, with the construction shown, organics 390, an open space 392, cathode 394, cover film 396, amorphous diamond-like film 398, an anode and lead 400, a substrate 402, an adhesive 404, and a cathode lead 406. FIG. 6B illustrates a device having, with the construction shown, organics 408, an open space 410, a cathode 412, a cover film 414, amorphous diamond-like film 416, an anode and lead 418, a substrate 420, an adhesive 422, and a cathode lead 424. FIG. 6C illustrates a device having, with the construction shown, organics 426, an open space 428, a cathode 430, a cover film 432, amorphous diamond-like film 434, contact vias 436, an anode and lead 438, a substrate 440, an adhesive 442, and a cathode lead 444.

In FIGS. 4A-4C, 5A-5C, and 6A-6C, the recited elements can be implemented with, for example, the following: the organics can include an OLED or any organic electronic device; the electronic device substrates can include any of those substrate materials identified above including flexible or rigid materials; the anode, cathode, and contact vias (or other types of electrodes such as a source, drain, and gate for a transistor) can include a metal or any conductive element; the adhesive can include any material capable of adhering together two or more components such as an optical adhesive; the cover film can include any material such as a polymer layer or a film such as PET as previously described for substrates and rigid materials such as glass and metal; and the amorphous diamond-like film can include a film of the amorphous diamond-like film as described above or other amorphous diamond-like film. Also, the encapsulating or protective layers of the devices shown in FIGS. 6A-6C, 7A-7C, and 8A-8C can be repeated to form any number of dyads, and the devices can alternatively include additional layers such as those identified above.

In lieu of contact vias, electrical contacts may be made by interleaving conductive paths between layers of encapsulating films. Such a contact can be formed by first coating through, for example, a shadow mask a substantial portion, typically more than one half, of the organic electronic device with a thin film encapsulant such that a portion of a device electrode remains exposed. A conductive film, such as a metal or transparent conductive oxide, is then deposited through a different mask such that contact is made with the exposed electrode and a portion of the conductive film is disposed on the initial encapsulation film. A second encapsulation film is then deposited such that the exposed portion of the device is covered as well as a portion of the first encapsulation film and conductive film. The end result is an organic electronic device covered by a thin film encapsulant and a conductive path from an electrode to the exterior of the device.

This type of encapsulation may be particularly useful for direct-drive OLED solid state lighting and signage applications as minimal patterning of the bottom electrode is required. Multiple layers with interleaved conductors may be deposited, and conductive paths to multiple electrodes on a single substrate may be established. The thin film encapsulants may include DLF, sputtered oxides, plasma polymerized films, thermally deposited materials such as SiO and GeO, and polymer/barrier multilayers.

It is also possible to combine the various embodiments of the present disclosure. For example, an OLED device can be directly encapsulated with amorphous diamond-like film as illustrated in the embodiments shown in FIGS. 4A-4C, followed by lamination of a protective film and a second layer of amorphous diamond-like film; in essence, this combines embodiments shown in FIGS. 4A-4C and 5A-5C.

The barrier coatings of embodiments of the present invention provide for several advantageous characteristics. The barrier coatings are hard and abrasion resistant, provide improved moisture and/or oxygen protection, may be single layers or multiple layers, have good optical properties, and can provide a way to edge-seal adhesive bond lines as illustrated in FIGS. 4C, 5C, and 6C. The barrier coatings may be applied to flexible and rigid devices or substrates.

Direct encapsulation of OLEDs provides for a process that can be carried out at high speed. The amorphous diamond-like film deposition process is rapid; 60 Å/second deposition rates have been shown and higher rates are possible. The amorphous diamond-like film deposition process may provide for single layer direct encapsulation, although multilayers may be desirable in some cases. The ion enhanced plasma deposition process, as described above and in the Examples, does not damage the OLED device layers. It has been found that the use of silicone oil reduces stresses found in prior deposited diamond like films. Stresses in the diamond-like film coatings can cause delamination of the OLED device architecture or topography in some instances. In particular, the formation of at least one amorphous diamond-like layer utilizing only siloxane as the carbon source resulted in significantly reduced stresses in the final encapsulated organic electronic devices such that delamination or cracks in the final encapsulated organic electronic devices were not detected. Any remaining stresses, if present, in the amorphous diamond-like coatings described herein can be eliminated, if desired, by placing protective and/or stress relieving coatings on top of the OLED prior to the amorphous diamond-like film encapsulation. Protective coatings could include, for example, metal films or ceramic films such as silicon monoxide or boron oxide. Boron oxide would also serve as a desiccant layer. Metallic protective films may require an insulating underlayer to avoid undesirable electrical shorting between individual emissive areas on a device. Stress relieving coatings can also include organic coatings on top of the OLED prior to amorphous diamond-like film encapsulation.

One method of applying stress reducing coatings includes depositing layers of deformable materials over top of the OLED prior to amorphous diamond-like film deposition. For example, copper phthalocyanine, or organic glass-like materials can be vapor deposited in vacuum from heated crucibles as the last step in the OLED device fabrication process. Stresses in the subsequent amorphous diamond-like film layers can be relieved by relaxation, deformation, or delamination of these layers, thereby preventing delamination of the OLED device layers.

Another method of applying protective and/or stress relieving coatings includes adhesively laminating a cover film onto the OLED. The cover film could be a transfer adhesive layer, such as a Thermobond™ hot melt adhesive or it could be PET, PEN, or the like, or a barrier film such as ultrabarrier film coated with an adhesive layer. An example of an embodiment having strain relief includes the construction shown in FIG. 5A without the cover film 346. Ultrabarrier films include multilayer films made, for example, by vacuum deposition of two inorganic dielectric materials sequentially in a multitude of layers on a glass or other suitable substrate, or alternating layers of inorganic materials and organic polymers, as described in U.S. Pat. Nos. 5,440,446; 5,877,895; and 6,010,751, all of which are incorporated herein by reference.

Bare adhesive or PET and PEN film layers may provide sufficient protection to allow an OLED device to be transferred under ambient conditions to a amorphous diamond-like film encapsulation tool. Ultrabarrier films may provide sufficient encapsulation to enable long device lifetimes. Depositing amorphous diamond-like film coatings over top of the encapsulation film seals the edges of the adhesive bond lines as well as provides an additional barrier coating on the surface of the encapsulating film. Substrates can also include non-barrier substrate materials, in which case the amorphous diamond-like film can also be used to encapsulate the substrate as shown in FIGS. 4B, 4C, 5B, 5C, 6B, and 6C.

A further advantage of the amorphous diamond-like film deposition process is that it has been demonstrated in a roll-to-roll format. Thus, the amorphous diamond-like film encapsulation method, including the use of protective stress relief, and/or cover film layers, is well suited to an OLED web manufacturing process. The process may be used on both top emitting and bottom emitting OLED device architectures.

Embodiments of the present invention will now be described with reference to the following non-limiting examples.

EXAMPLES

Example 1

Figure 7:
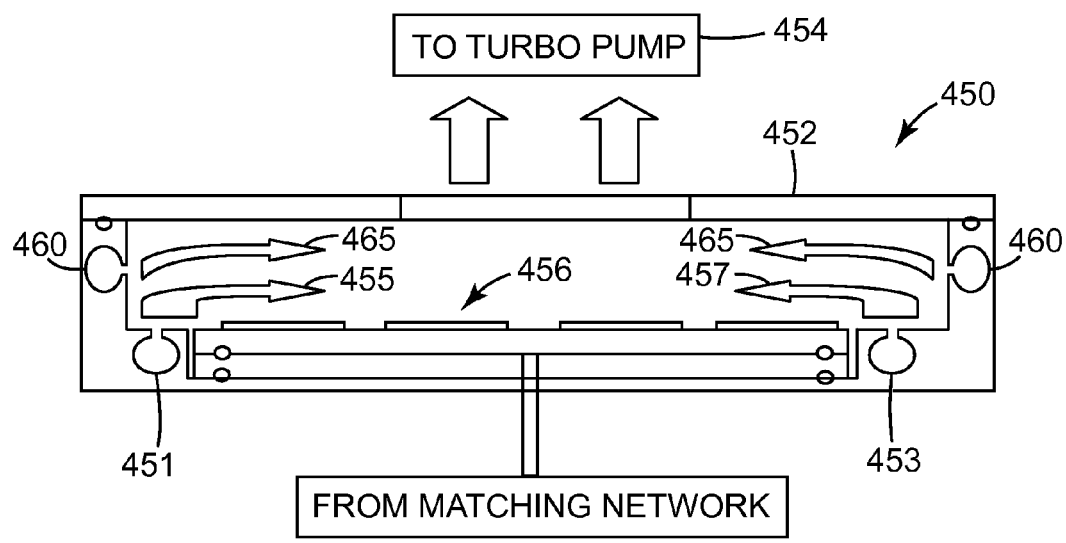
FIG. 7 is a diagram of a plasma deposition system for applying amorphous diamond-like coatings.

As shown in FIG. 7, a plasma deposition system 450 was used for the deposition of the amorphous diamond-like film onto devices 456. System 450 includes an aluminum vacuum chamber 452 containing a 12"×12" bottom electrode with the chamber walls acting as the counter-electrode. The spacing between the powered electrode and the grounded electrode is three inches. Because of the larger surface area of the counter-electrode, the system may be considered to be asymmetric, resulting in a large sheath potential at the powered electrode on which the substrates to be coated are placed. The chamber is pumped by a pumping system 454, which comprises a turbomolecular pump (Pfeiffer Model No. TPH510) backed by a mechanical pump (Edwards Model No. 80). A gate valve serves to isolate the chamber from the pumping system when the chamber is vented.

Process gases 455 and 457 are metered through mass flow controllers (Brooks Model No. 5850 S) and blended in a manifold before they are introduced into the chamber through gun-drilled holes 451 and 453 parallel to the electrode and linked into the chamber by a multitude of smaller (0.060" diameter) holes spaced one inch apart. Siloxane source (i.e., silicone oil) 460 vapor 465 is provided into the vacuum chamber through any useful means. In one embodiment, silicone oil is 460 disposed on graphite or carbon cloth in electrical connection to a power source and is vaporized (by heating the carbon cloth via passing current through the carbon cloth) within the vacuum chamber while being shielded from the plasma with a Faraday cage.

Pneumatic valves serve to isolate the flow controllers from the gas/vapor supply lines. The process gases, oxygen 455 (ultrahigh purity 99.99%, from Scott Specialty Gases) and tetramethylsilane 457 (TMS NMR grade, 99.9%, from Sigma Aldrich) are stored remotely in gas cabinets and piped to the mass flow controllers by 0.25" (diameter) stainless steel gas lines. The typical base pressure in the chamber is below $1\times10^{-5}$ Torr based on the size and type of the pumping system. Pressure in the chamber is measured by a 0.1 Torr capacitance manometer (type 390 from MKS Instruments).

The plasma is powered by a 13.56 MHz radio frequency power supply (Advanced Energy, Model RFPP-RF10S) through an impedance matching network (Advanced Energy, Model RFPP-AM20). The AM-20 impedance network was modified by changing the load coil and the shunt capacitance to suit the plasma system constructed. The impedance matching network serves to automatically tune the plasma load to the 50 ohm impedance of the power supply to maximize power coupling. Under typical conditions, the reflected power is less than 2% of the incident power.

Bottom emitting glass OLEDs containing four independently addressable 5 mm×5 mm pixels were fabricated on patterned ITO coated glass (20 Ohm/sq, available from Midwest Micro-Devices LLC, Toledo Ohio) substrates by conventional thermal vapor deposition through shadow masks in a bell jar evaporator evacuated to $5\times10^{-6}$ torr. The OLED device layers deposited on top of the patterned ITO anodes were (in order of deposition):/NPD (400 Å at 1 Å/s)/AlQ doped with C545T (1% doping, 300 Å at 1 Å/s)/AlQ(200 Å at 1 Å/s)/LiF(7 Å at 0.5 Å/s)/Al(2500 Å at 25 Å/s).

Figure 8:
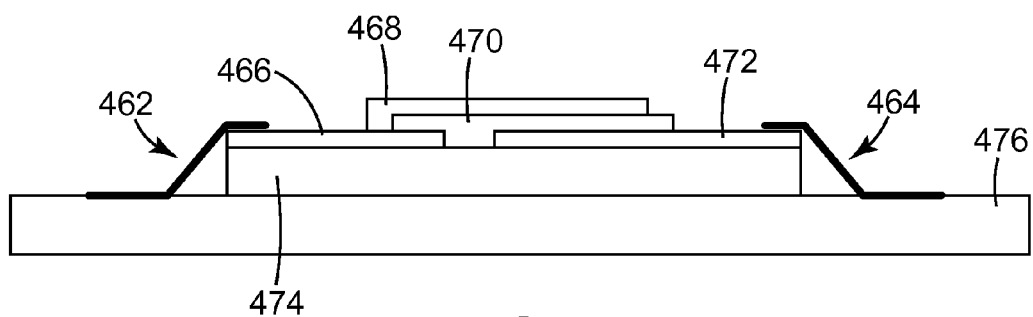
FIG. 8 is a schematic diagram of a sample mounting for amorphous diamond-like coating deposition.

An unencapsulated glass four pixel bottom emitting green OLED device was placed in the plasma deposition chamber batch coater described above and shown in FIG. 7 (OLED coated side facing up) and held to the electrode with strips of 3M Scotch™ 811 removable tape along each edge of the device as shown in FIG. 8. The schematic illustrates, with the construction shown in FIG. 8, tape 462, 464, an ITO cathode pad 466, a cathode 468, an organic electronic device 470, an ITO anode 472, a device substrate 474, and an amorphous diamond-like film layer 476. The tape (462 and 464) prevents device movement during amorphous diamond-like film deposition and serves as a mask to prevent amorphous diamond-like film deposition over portions of the ITO cathode and anode leads, thereby allowing for electrical contact after encapsulation.

The system, the device shown in FIG. 8 in the chamber shown in FIG. 7, was pumped to base pressure (below about 1×10$^{-3}$ Torr) and oxygen gas was introduced at a flow rate of 150 sccm which produced a pressure of about 7 to 8 mTorr. The sample (device) surface was primed by a 10 second exposure to oxygen plasma (1000 watt RF power). With the plasma still ignited, a 1.7 A current was applied to the graphite heating cloths which vaporized a 0.6 g sample of silicone oil (DMS-S12, Gelest, Inc. Morrisville, Pa.), that was placed onto the carbon cloths previously, into the RF plasma. Without extinguishing the plasma and after a 5 to 10 second delay, tetramethylsilane gas was introduced (50 sccm) while maintaining the oxygen flow at 150 sccm and 1.7 A current flow through the carbon cloths for 2 minutes. This produced approximately 1000 nm thick amorphous diamond-like film on top of and around the OLED device. After removal from the plasma chamber, a nearly colorless and optically uniform amorphous diamond-like film could be seen on the top surface of the device when viewing the device from an angle. Other than this film, the OLED device was visibly unchanged by the deposition process. Operational characteristics of voltage and brightness for the amorphous diamond-like film encapsulated device were compared to an OLED device that was left bare and no noticeable difference was measured between the amorphous diamond-like film encapsulated and bare OLED devices.

Example 2

The same apparatus and procedure described in Example 1 was used to make an encapsulation layer on a second 4 pixel OLED device. However, the flow of TMS was set to zero which resulted in a silicone only amorphous diamond-like film encapsulation film. After removal from the plasma chamber, a nearly colorless optically uniform diamond-like film could be seen on the top surface of the device when viewing the device from an angle. Other than this film, the OLED device was visibly unchanged by the deposition process. When compared to a bare unencapsulated control device, no noticeable difference in performance was measured.

Example 3

The same apparatus and procedure described in Example 1 was used to make an encapsulation layer on a second 4 pixel OLED device with a 225 sccm flow of anhydrous ammonia instead of oxygen. This produced a nitride amorphous diamond-like film over and around the OLED device. After removal from the plasma chamber, a nearly colorless optically uniform diamond-like film could be seen on the top surface of the device when viewing the device from an angle. Other than this film, the OLED device was visibly unchanged by the deposition process. When compared to a bare unencapsulated control device, no noticeable difference in performance was measured.

Example 4

An OLED device that was left bare, that is, no attempt was made to protect the OLED device from the environment, was operated continuously at 8V and left out in ambient conditions of a laboratory. After approximately 24 hours the device was completely dead. Simultaneously, the encapsulated device from Example 1 was also continuously operated at 8V and left out in ambient laboratory conditions. The device remained operational after more than 1000 hours of continuous operation.

Example 5

Transmission infrared spectra were measured from germanium wafers (source) that had amorphous diamond-like film coatings deposited onto them following the same process and material steps illustrated in Examples 1, 2, and 3. In Examples 1 and 2 the infrared transmission spectra yielded strong absorbances in the 1050 cm−1 to 1070 cm−1 range indicating the presence of Si—O bonding. Two additional absorbencies were measured in the 830 cm−1 to 880 cm−1 range indicating the presence of silicone (—Si(CH3)2-O—Si(CH3)2-O—) bonding. When compared to examples 1 and 2, the infrared measurements for Example 3 (DLF films made with anhydrous ammonia) showed substantial variation; there was a large reduction in absorbance in the Si—O band (1050 cm−1 to 1070 cm−1) and the disappearance of the absorbencies in the silicone band (830 cm−1 to 880 cm−1) indicating that the oxygen was replaced with nitrogen in the amorphous diamond-like film.

Example 6

A four pixel OLED device was encapsulated by the same process steps and materials described in Example 1 and was further encapsulated by a PEN film (0.005 inches thick, Dupont Teijin Films) coated on both sides with multilayer barrier coatings. The additional encapsulation was made by laminating the barrier film with a pressure sensitive adhesive (ARclear® 90537, Adhesives Research Inc., Glen Rock, Pa.) directly to the amorphous diamond-like film layer of the amorphous diamond-like film encapsulated OLED device. No difference in device performance was measured when compared to bare, un-encapsulated control device.

Thus, embodiments of the MOISTURE BARRIER COATINGS FOR ORGANIC LIGHT EMITTING DIODE DEVICES are disclosed. One skilled in the art will appreciate that the present invention can be practiced with embodiments other than those disclosed. The disclosed embodiments are presented for purposes of illustration and not limitation, and the present invention is limited only by the claims that follow.

What is claimed is:

1. A process for fabricating an amorphous diamond-like film layer for protection of a moisture or oxygen sensitive organic light emitting diode, comprising:
    forming a plasma at a pressure of 5-20 mTorr from vaporized silicone oil to decompose the silicone oil and form free radical species;
    reacting the free radical species at the surface of the organic light emitting diode to deposit an amorphous diamond-like plasma polymerized film layer from the plasma onto the moisture or oxygen sensitive organic light emitting diode thereby forming a protected organic light emitting diode.

2. A process according to claim 1, wherein the plasma is an ion enhanced plasma formed with a radio frequency power source.

3. A process according to claim 1, wherein the forming step comprises forming a plasma from a silane source and silicone oil.

4. A process according to claim 3, wherein the depositing step comprises depositing an amorphous diamond-like film layer from the plasma, the amorphous diamond-like film layer comprises two or more layers of amorphous diamond-like film.

5. A process according to claim 1, wherein the depositing step comprises depositing an amorphous diamond-like film layer from the plasma on a flexible film comprising a polymeric or metallic material.

6. A process according to claim 1, comprising encapsulating the moisture or oxygen sensitive organic light emitting diode with the amorphous diamond-like film layer to form a protected organic light emitting diode.

7. A process according to claim 1, further comprising disposing a polymer layer between the moisture or oxygen sensitive organic light emitting diode and the amorphous diamond-like film layer.

8. A process according to claim 1, wherein the depositing step forms an amorphous diamond-like layer having a thickness in a range from 1000 to 25000 Angstroms.

9. A process according to claim 1, wherein the forming step comprises forming a plasma from tetramethylsilane, silicone oil and one or more of oxygen, nitrogen, argon, or ammonia.

10. A process according to claim 1, further comprising disposing a polymer layer on the amorphous diamond-like film layer.

11. A process according to claim 1, further comprising disposing a polymer layer between the moisture or oxygen sensitive organic light emitting diode- and the amorphous diamond-like film layer and disposing a second polymer layer on the amorphous diamond-like film layer.

12. A process according to claim 1 wherein the depositing is carried out under a negative self-bias potential of greater than 500 Volts.

* * * * *